United States Patent
Lee et al.

(10) Patent No.: US 8,620,007 B2
(45) Date of Patent: Dec. 31, 2013

(54) HEADSET CAPABLE OF BEING USED AS EXTERNAL SPEAKER AND METHOD OF ADJUSTING AN OUTPUT THEREOF

(75) Inventors: Seung Jai Lee, Goyang-si (KR); Suk Ryun Son, Seoul (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 1290 days.

(21) Appl. No.: 12/187,768

(22) Filed: Aug. 7, 2008

(65) Prior Publication Data
US 2009/0041267 A1    Feb. 12, 2009

(30) Foreign Application Priority Data
Aug. 9, 2007 (KR) ........................ 10-2007-0079986

(51) Int. Cl.
*H03G 3/00* (2006.01)
(52) U.S. Cl.
USPC ........................................ 381/104; 381/120

(58) Field of Classification Search
USPC ........................................... 381/104, 120, 374
See application file for complete search history.

(56) References Cited

U.S. PATENT DOCUMENTS

| | | | |
|---|---|---|---|
| 6,263,085 B1 * | 7/2001 | Weffer | 381/371 |
| 6,980,666 B1 * | 12/2005 | Owen | 381/371 |
| 2006/0093161 A1 * | 5/2006 | Falcon | 381/104 |
| 2007/0003098 A1 * | 1/2007 | Martenson et al. | 381/388 |
| 2007/0053539 A1 * | 3/2007 | Tsunoda et al. | 381/377 |
| 2007/0258614 A1 * | 11/2007 | Langberg | 381/379 |
| 2008/0166002 A1 * | 7/2008 | Amsel | 381/370 |

* cited by examiner

*Primary Examiner* — Kimberly Rizkallah
*Assistant Examiner* — Duy T Nguyen
(74) *Attorney, Agent, or Firm* — Cha & Reiter, LLC

(57) ABSTRACT

A headset used as an external louder speaker and a method for adjusting an output of the speaker transducers are disclosed. The headset includes a signal receiver, speaker parts, hinge parts, and amplifiers. The speaker parts change their direction through the hinge parts. The output of speaker transducers is adjusted according to the direction of the speaker parts. When the output of speaker transducers is increased, the speaker parts of the headset are used as an external speaker.

16 Claims, 10 Drawing Sheets

PRIOR ART

HEADSET CAPABLE OF BEING USED AS EXTERNAL SPEAKER AND METHOD OF ADJUSTING AN OUTPUT THEREOF

CLAIM OF PRIORITY

This application claims the benefit of the earlier filing date, pursuant to 35 USC 119, to that patent application entitled "HEADSET CAPABLE OF BEING USED AS EXTERNAL SPEAKER AND METHOD FOR ADJUSTING OUTPUT AN THEREOF," filed in the Korean Intellectual Property Office on Aug. 9, 2007 and assigned Serial No. 2007-0079986, the contents of which are incorporated herein by reference.

BACKGROUND OF THE INVENTION

1. Field of the Invention

The present invention relates to a headset that enables its speaker parts to change direction and a method of adjusting the output of speaker transducers of the headset according to the direction of the speaker parts.

2. Description of the Related Art

Audio equipment is used to reproduce, record, or process sound, and includes radio, cassette players, CD players, etc. In recent years, MP3 players, portable multimedia players, etc. have been used to reproduce audio sounds and movies when a user is in motion. Even portable terminals have functions to play music or moving images. Headsets are typically, used to individually listen to sounds output from these devices. In particular, the number of users who use wireless headsets is increasing due to the convenience of their use and their providing better signal quality over earplugs when a user is in motion.

FIG. 1 is a view illustrating a conventional wireless headset that receives a signal from a portable terminal via short-range communication.

As shown in FIG. 1, the wireless headset 100 includes a head band 110 and a speaker part 120. The speaker part 120 includes a speaker that outputs sound using well known principles, which need not be discussed herein. The headband 110 is placed on the user's head and accordingly the speaker part 120 is positioned close to the user's ears.

The conventional portable terminal 200 has the capability to reproduce music or audio associated with moving images as well as other functions, such as telephone call service. The wireless headset 100 can be connected with the portable terminal 200 via one or more short-range wireless communication technologies, e.g., Bluetooth, Zigbee, etc., The wireless headset 100 can receive signals from the portable terminal 200 via short-range wireless communication, in which the signals correspond to a voice when the calling function is in operation, music or audio when music files are being played or audio files associated with moving images (video).

When users wear the headset 100 for a relatively long period of time, their ears become numb and their hearing can become impaired. Therefore users frequently want to listen to sounds from the portable terminal without wearing the headset 100. To this end, they must carry an additional external speaker to interface with the portable terminal, which makes the portable terminal inconvenient to use.

SUMMARY OF THE INVENTION

The present invention provides a headset that can adjust the output of speaker transducers according to the direction of the speaker parts, and a method for adjusting the output of transducers of the headset.

The present invention further provides a headset whose speaker parts are mechanically controlled and may be used as an external speaker.

In accordance with an exemplary embodiment of the present invention, the present invention provides a headset including a signal receiver, speaker parts, hinge parts, and amplifiers. The signal receiver receives a signal wirelessly from an external source. The speaker parts have speaker transducers respectively. The hinge parts change the direction of the speaker parts and are located in close proximity to the speaker parts. The amplifiers amplify the voice signal and are located between the signal receiver and the speaker parts. Here, the signal receiver is electrically connected, through the amplifiers, to the speaker transducers or directly connected to the speaker transducers bypassing the amplifiers, according to the direction of the speaker parts.

Preferably, the hinge parts include rotational hinges that rotate the speaker parts at a certain angle.

In accordance with another exemplary embodiment of the present invention, the present invention provides a headset that includes a signal receiver, speaker parts, hinge parts, sensors, amplifiers, and controller. The signal receiver receives a signal from an external source. The speaker parts have speaker transducers respectively. The hinge parts change the direction of the speaker parts and are located in close proximity to the speaker parts. The sensors detect the direction of the speaker parts and are located in close proximity to the hinge parts. The amplifiers amplify the received signal and are located between the signal receiver and the speaker parts. The controller controls the amplifiers to adjust the output of the speaker transducers according to the detected direction of the speaker parts.

Preferably, the hinge parts include rotational hinges for rotating the speaker parts at a certain angle. The speaker parts are operated in a headset mode direction or in a speaker mode direction according to their rotation. The controller decreases the output of the transducers when the speaker parts are in a headset mode direction and increases the output of the transducers when the speaker parts are in a speaker mode direction.

Preferably, the headset may further include a protection switch. Here, the controller increases the output of the speaker transducers when the speaker parts are in a speaker mode direction and the protection switch is switched off.

Preferably, the hinge parts further include collapsible hinges. The speaker parts are collapsed, with respect to the lengthwise center axis of a headband, through the collapsible hinges, at a certain angle. The headband forms a flat surface on at least one part thereof. The speaker parts are in a standing position on the ground in the speaker mode when the flat surface of the headband is placed on the ground and the headband serves as a support.

Preferably, each of the speaker parts includes first and second speaker transducers. The first speaker transducer operates in a first frequency range (e.g., a woofer) and the second speaker transducer operates is a second frequency range (e.g., a tweeter). The controller controls the first and second speaker transducers, individually.

In accordance with another exemplary embodiment of the present invention, the present invention provides a method for adjusting the output of speaker transducers in a headset that has speaker parts whose direction can be changed, the method including: detecting direction of the speaker parts, determining whether the detected direction of the speaker parts is in a speaker mode direction or in a headset mode direction; and increasing an output of the speaker transducers of the speaker parts in the speaker mode direction or decreasing an output of speaker transducers in the headset mode direction.

Preferably, the determination includes checking whether a protection switch is switched off and ascertaining that the headset is in a speaker mode.

BRIEF DESCRIPTION OF THE DRAWINGS

The features and advantages of the present invention will be more apparent from the following detailed description in conjunction with the accompanying drawings, in which.

DETAILED DESCRIPTION OF THE INVENTION

Exemplary embodiments of the present invention are described in detail with reference to the accompanying drawings. Detailed descriptions of well-known functions and structures incorporated herein may be omitted to avoid obscuring the subject matter of the present invention. Although the drawings represent an embodiment of the invention, the drawings are not necessarily to scale and certain features may be exaggerated or omitted in order to better illustrate and explain the present invention. The same reference numbers are used throughout the drawings to refer to the same or similar parts.

Figure 1:
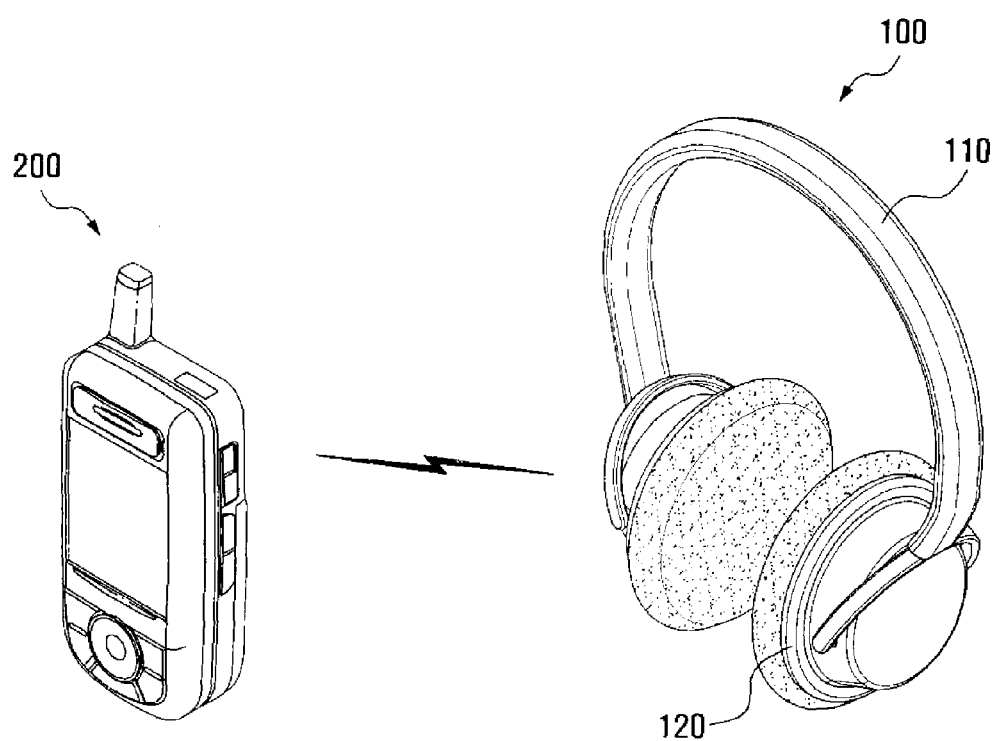
FIG. 1 is a view illustrating a conventional wireless headset that receives a signal from a portable terminal via short-range communication.
Figure 2:
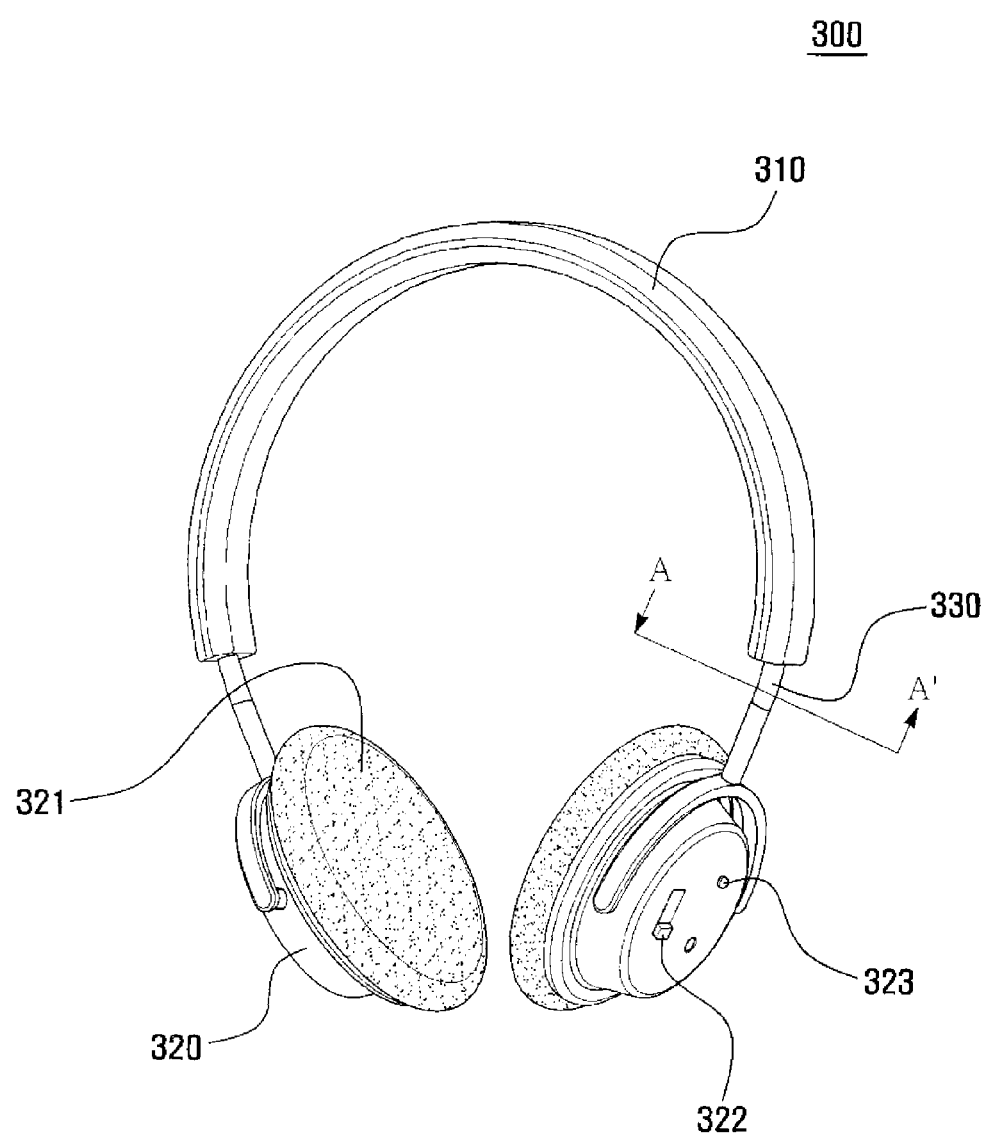
FIG. 2 is a perspective view illustrating a headset according to an embodiment of the present invention.

FIG. 2 is a perspective view illustrating a headset according to an embodiment of the present invention.

As shown in FIG. 2, the headset 300 includes a headband 310, speaker parts 320, and hinge parts represented as rotational hinges 330.

The headband 310, according to the illustrated embodiment of the present invention, is shaped as a semi-circular form, so that a user can comfortably wear it. It should, however, be understood that the shape of headband 310 is not limited by this embodiment, and instead may be formed in a number of different forms. In order to provide a comfortable fit to a user, the headband 310 may be configured in such a way that its outer side is wrapped in a fluffy material, such as cotton wool, sponge, etc. Additionally, the headband 310 can be adjusted in length to fit to the user's head size.

The speaker parts 320 are each located at both ends of the head band 310. The speaker parts 320 each have a speaker transducer therein (not shown). The speaker parts 320 are both configured in such a way that the portions contacting the user's ears are wrapped by a member 321 made of cotton wool or sponge, so that the headset has a comfortable fit when positioned against the user's ears. One of the speaker parts 320 may include a protection switch 322. The protection switch 322 serves to prevent a louder sound output from the speaker transducers due to a malfunction of the headset 300 while the user is wearing the headset 300. One of the speaker parts 320 may include an LED 323 adjacent to the protection switch 322. The LED 323 emits light only when the protection switch 322 is switched on to indicate an operation state of the protection switch 322.

The hinge parts may be implemented by rotational hinges 330, each of which is located between the headband 310 and corresponding speaker parts 320. Each of the rotational hinges 330 can be rotated through to a desired angle. Therefore, the speaker parts 320 can be rotated to the desired angle as the rotational hinges 330 rotate through the desired angle. It should be understood that the hinge part can be implemented by collapsible hinges or by a combination of rotational and collapsible hinges.

Figure 3:
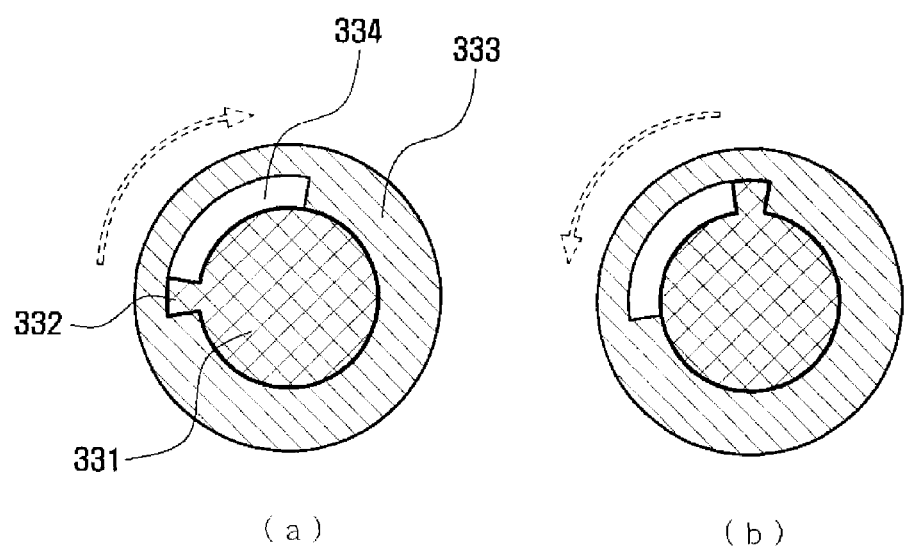
FIG. 3A and FIG. 3B are cross-sectional views illustrating a rotational hinge of FIG. 2, taken along line A-A', according to an embodiment of the present invention.

FIG. 3A and FIG. 3B are cross-sectional views illustrating a rotational hinge of FIG. 2, taken along line A-A', according to an embodiment of the present invention.

As shown in FIG. 3A and FIG. 3B, the rotational hinge 330 is configured to include a center shaft 331 and an outer wall 333. The center shaft 331 is rotatably fitted within the center of the outer wall 333. The outer wall 333 forms a groove 334 along the inner side at an arc length (an arc angle) with respect to the center thereof. The center shaft 331 has a protrusion or tab 332 that is placed within and moved along the groove 334 of the outer wall 333. Therefore, the rotation of the center shaft 331 can be confined within the arc angle of the groove 334. That is, the rotational angle of the rotational hinge 330 is determined by the arc formed as groove 334 of the outer wall 333. The center shaft 331 of the rotational hinge 330 is connected to the speaker part, so that the rotation of the center shaft 331 makes the speaker part to rotate through a desired angle. FIG. 3A illustrates the rotation of the hinge 330 in a first position, wherein tab 332 is shown in a first position (e.g., horizontal) and FIG. 3B illustrates the rotation of the hinge 330 in a second position, wherein tab 332 is shown in a second position.

Returning to FIG. 2, the headset 300 is set up with both front sides of the speaker parts 320 facing each other, so that both the front sides can contact the user' ears when the user wears the headset 300. When the speaker parts 320 are positioned as described above, it is said that the speaker parts 320 are in a "headset mode direction" or the headset 300 is in a "headset mode."

Figure 4:
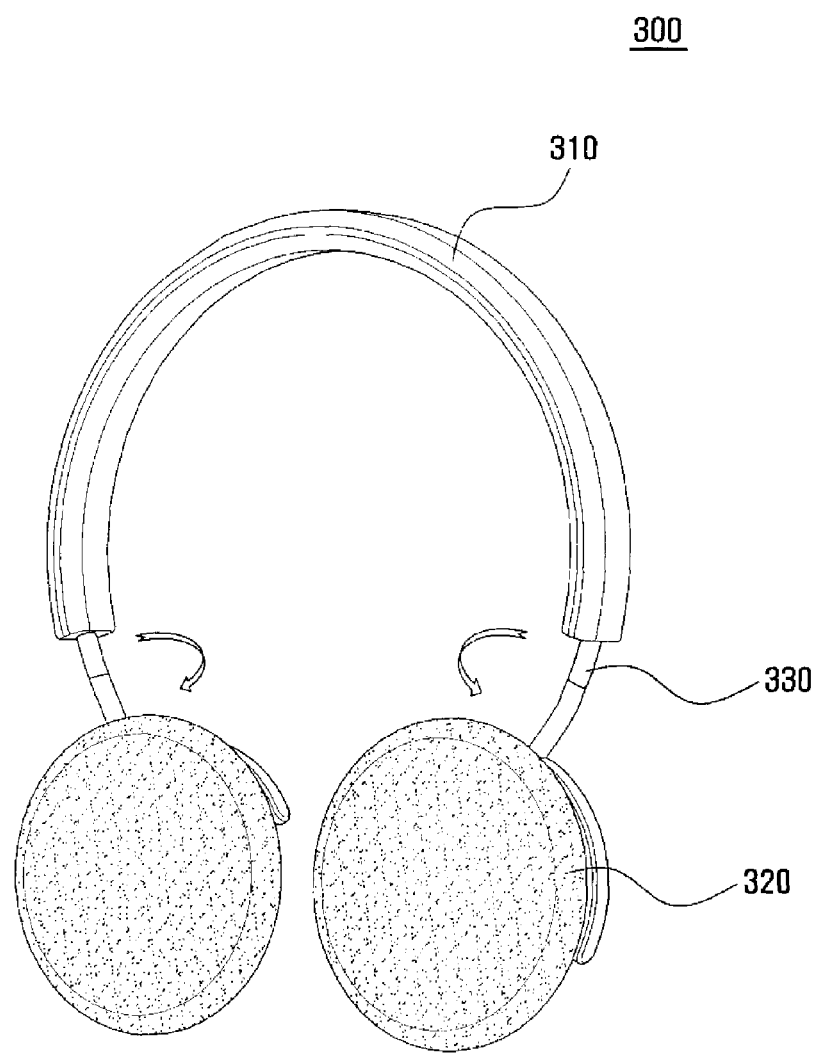
FIG. 4 is a view illustrating a headset, according to an embodiment of the present invention, where both front sides of the speaker parts of the headset rotate and face each other.

However, as shown in FIG. 4, the speaker parts 320 of headset 300 have a directional change through the rotational hinges 330. The rotational angle of the speaker parts 320 can be adjusted to a desired angle as the groove 332 formed at the outer wall of the rotational hinge 330, is adjusted (FIGS. 3A-3B). When the speaker parts 320 change their direction, their front sides are parallel to each other. That is, when both the front sides of the speaker parts 320 are exposed to the outside, it is said that the speaker parts 320 are in a "speaker mode direction" or the headset 300 is in a "speaker mode."

Figure 5:
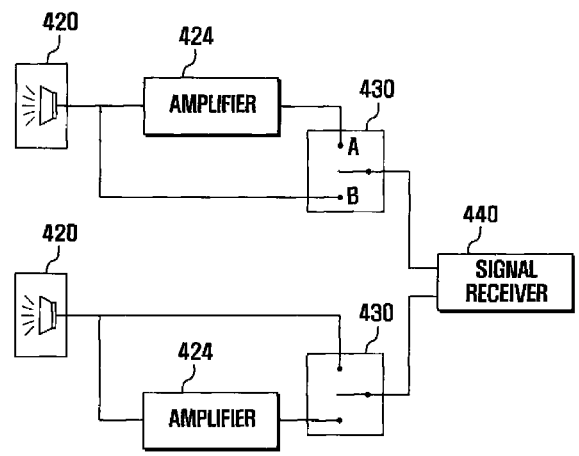
FIG. 5 is a schematic block diagram illustrating a headset according to an embodiment of the present invention.

FIG. 5 is a schematic block diagram illustrating a headset according to an embodiment of the present invention.

As shown in FIG. 5, the headset includes amplifiers 424 and a signal receiver 440. The signal receiver 440 receives a signal from the portable terminal. The portable terminal may be a portable electronic device, such as personal digital assistant (PDA), portable multimedia player, digital broadcasting receiver, etc. The signal receiver 440 is connected to the portable terminal by wired or wireless communication. In particular, the signal receiver 440 may further include a wireless communication unit for communicating with a portable terminal via short-range wireless communication.

The amplifiers 424 amplify a signal output from the signal receiver 440. Each of the amplifiers 424 connects one terminal to each corresponding one of the speaker parts 420, and another terminal to each of the rotational hinges 430. The rotational hinges 430 are rotated by a certain angle to switch the electrical connection paths between the signal receiver 440 and the speaker parts 420, respectively. That is, the rotational hinges 430 change the direction of the speaker parts 420 and serve as an electrical switch. Each of the rotational hinges 430 has electrical contacts at both the protrusion and the groove. When the speaker parts 420 change their direction to be in a speaker mode direction, the rotational hinges 430 establish electrical connection path A, so that a signal is transmitted from the signal receiver 440 to the speaker transducers of the speaker parts 420 via the amplifiers 424. In that case, the speaker parts 420 have a higher output and the headset serves as an external speaker. In another aspect, when the speaker parts 420 change direction to be in a headset mode direction, the rotational hinges 430 establish electrical connection path B, so that a signal is transmitted from the signal receiver 440 to the speaker transducers of the speaker parts 420. That is, the signal bypasses the amplifiers 424 so as not to be amplified. Therefore, the speaker parts 420 output a relatively low level of sound. In this case, when a user wears the headset and listens to the sound, the sound is produced at a comfortable level.

In the embodiment of the present invention, the speaker transducer of each of the speaker parts 420 is designed to have output power less than 0.5 W when the speaker parts 420 are in a headset mode direction and over 2 W in a speaker mode direction. The range of output power of the speaker transducer can be determined according to the headset use and the price of the headset, etc. Since a signal is transmitted from the signal receiver 440 to the respective speaker parts 420 through different paths, the headset according to an embodiment of the present invention can output stereo sounds. As a modification of the present invention, the headset can be implemented in such a way that a signal can be transmitted to both speaker parts using only one amplifier.

Figure 6:
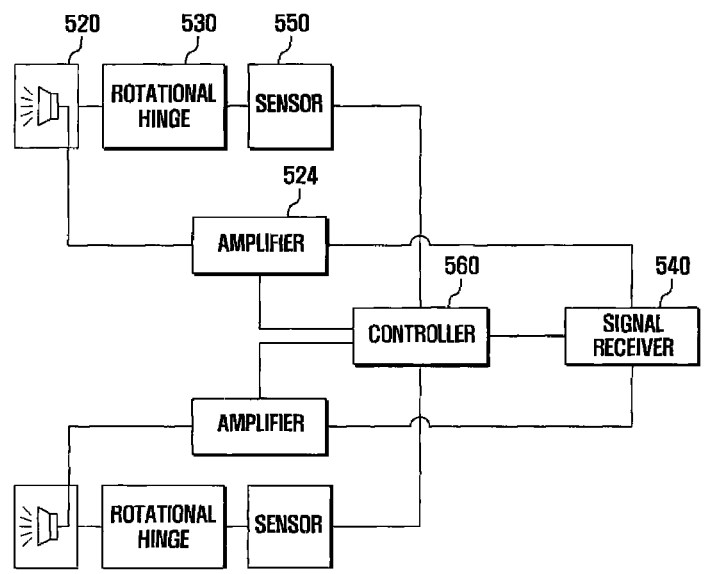
FIG. 6 is a schematic block diagram illustrating a headset according to another embodiment of the present invention.

FIG. 6 is a schematic block diagram illustrating a headset according to another embodiment of the present invention.

As shown in FIG. 6, the headset includes sensors 550 and a controller 560 as well as the elements in the embodiment of FIG. 5, include speaker parts 520, rotational hinges 530, amplifiers 524, and signal receiver 540. In this embodiment, the rotational hinges 530 serve to change the direction of the speaker parts 520. Each of the sensors 550 is placed at a position close to each of the rotational hinges 530 and detects the direction of each of the speaker parts 520. The controller 560 controls the amplifiers 524 to adjust the output power of the speaker transducers, according to the detected direction of each of the speaker parts 520. That is, the controller 560 increases the output power of the speaker transducers when the speaker parts 520 are in a speaker mode direction and decreases the output power in a headset mode direction.

Figure 7:
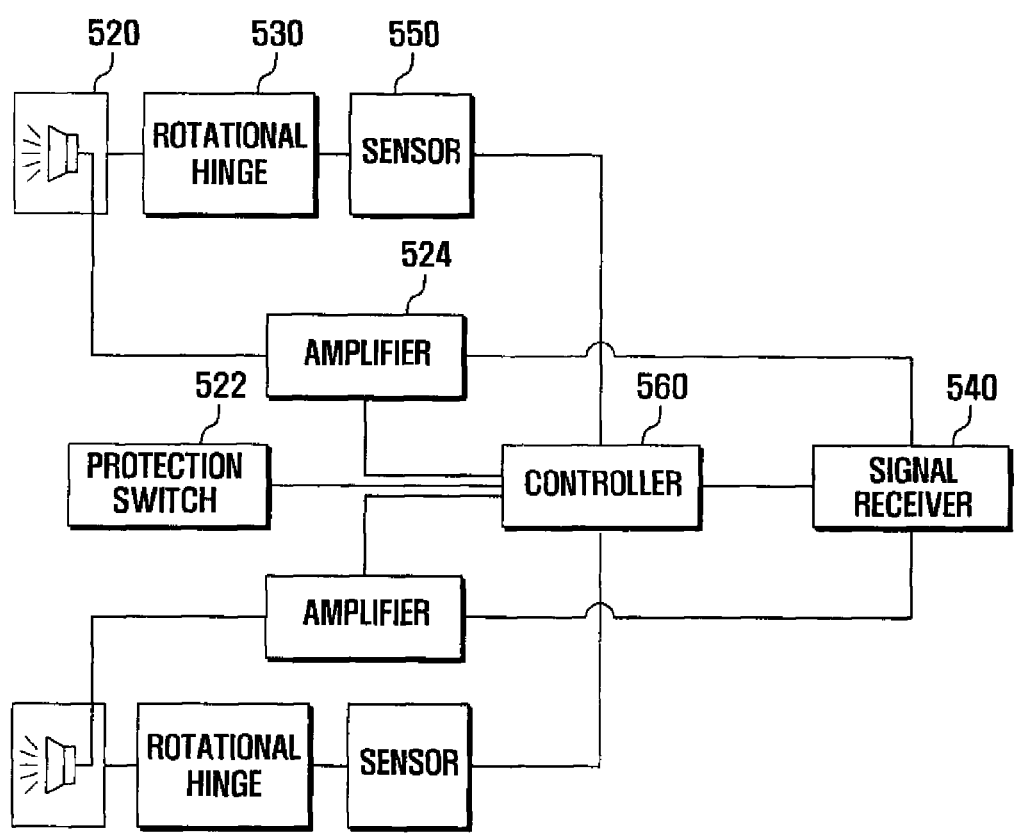
FIG. 7 is a schematic block diagram illustrating a headset having a protection switch according to another embodiment of the present invention.

FIG. 7 is a schematic block diagram illustrating a headset having a protection switch according to an embodiment of the present invention.

As shown in FIG. 7, the headset includes a protection switch 522 in addition to the elements in the embodiment of FIG. 6. The protection switch 522 is located between the controller 560 and each of the speaker parts 520. When the speaker parts 520 are operating in a speaker mode direction, the controller 560 determines whether the protection switch 522 is switched off. When the controller ascertains that the protection switch 522 is switched off, it controls the amplifiers 524 to increase the output of the speaker transducers of the speaker parts 520. When the controller ascertains that the protection switch 522 is switched on, it controls the amplifiers 524 to decrease the output of the speaker transducers even if the speaker parts 520 are in a speaker mode direction or because of a malfunction the speaker parts believed to be in the speaker mode direction. The headset, including this protection switch 522, can prevent the output of speaker transducers from increasing, even if a user does not recognize a malfunction of the sensors 550 and happens to wear the headset 310 in the headset mode.

Figure 8A:
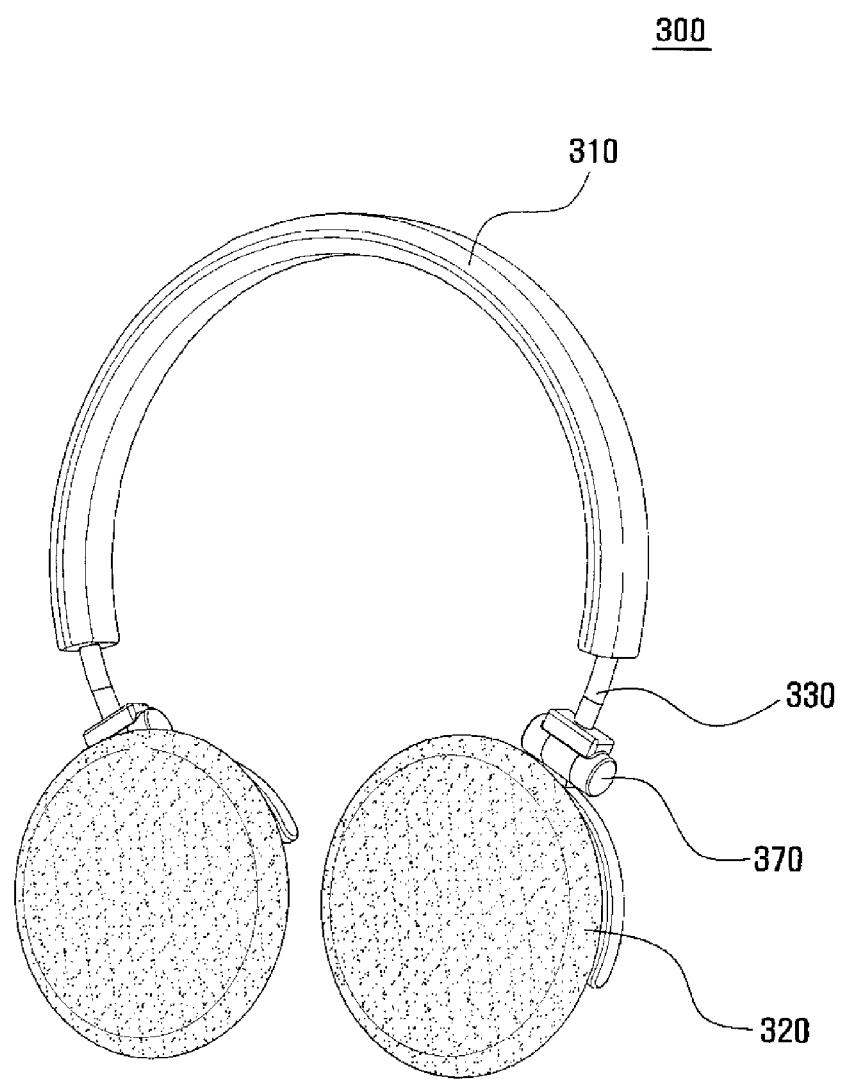
FIG. 8A and FIG. 8B are a view illustrating a headset having a collapsible hinge according to another embodiment of the present invention.
Figure 8B:
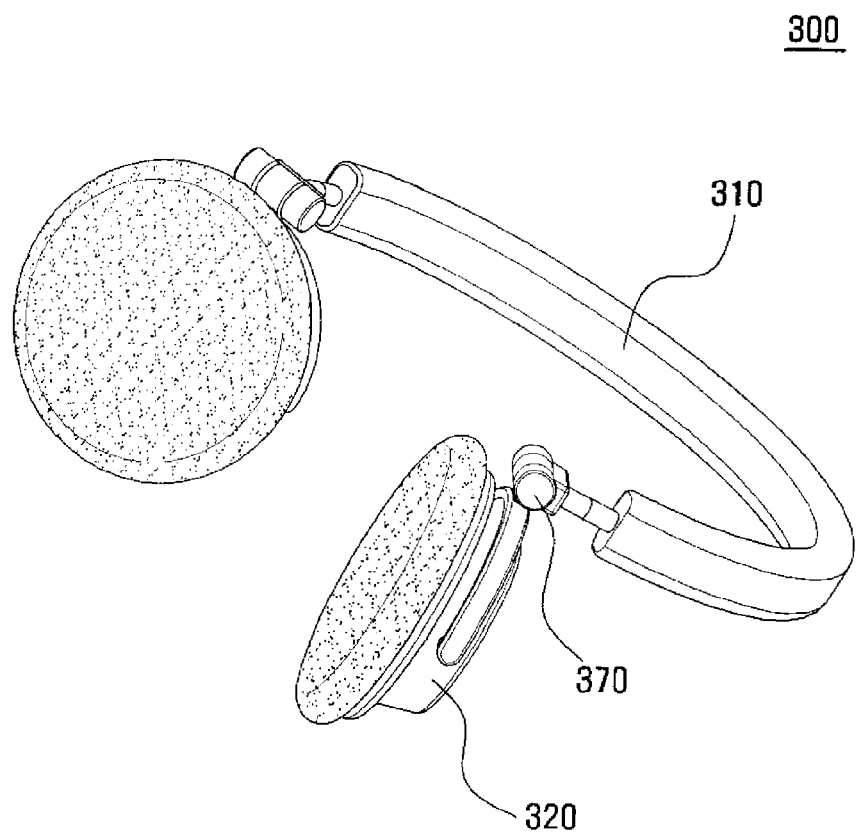

FIG. 8A and FIG. 8B are a view illustrating a headset having a collapsible hinge according to another embodiment of the present invention.

As shown in FIG. 8A and FIG. 8B, the hinge parts of the headset 300 may further include collapsible hinges 370 which are located between the speaker parts 320 and the rotational hinges 330. In a modification of the present invention, each of the rotational hinges 370 is located between the headband 310 and each of the rotational hinges 330.

As shown in FIG. 8A, the headset is in a speaker mode as its speaker parts 320 are rotated by the rotational hinges 330. In this speaker mode, as shown in FIG. 8B, the speaker parts 320 are collapsed, through the collapsible hinges 370, with respect to the lengthwise center axis of the headband 310. That is, the angle between the lengthwise center axis of the headband 310 and each of the speaker parts 320 is adjusted by the collapsible hinges 370. When the headset 300 is placed on the ground, the speaker parts 320 can be in a standing position as the headband 310 serves as a holder. When the speaker parts 320 are in a standing position, the headset 300 may sway due to the curved portion of the headband 310. In order to prevent this swaying movement, the headband 310 is formed to be flat on the undersurface that contacts the ground.

Figure 9:
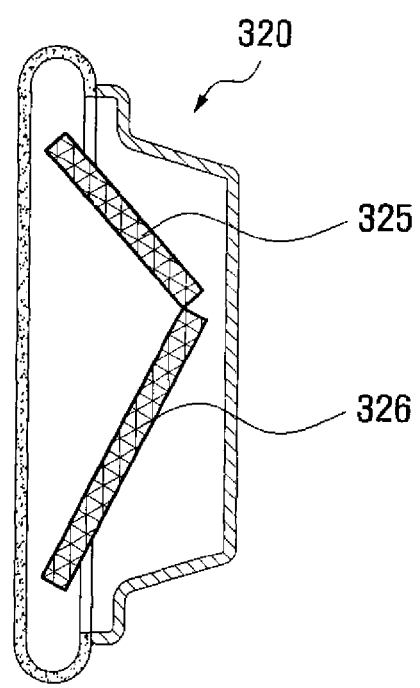
FIG. 9 is a cross-sectional view illustrating each of the speaker parts of a headset according to another embodiment of the present invention.

FIG. 9 is a cross-sectional view illustrating each of the speaker parts of a headset according to another embodiment of the present invention.

As shown in FIG. 9, each of the speaker parts 320 includes a first speaker transducer 325 and a second speaker transducer 326. The first and second speaker transducers 325 and 326 are aligned in such a way that their front sides form a certain angle. It is preferable that the first and second speaker transducers 325 and 326 are aligned at an obtuse angle to increase the user's comfort. In the present embodiment, the first speaker transducer 325 operates in a frequency range that is known in the art to be accommodated by a speaker unit termed "a woofer" and the second speaker transducer 326 operates in a frequency range that is known in the art to be accommodated by a speaker unit termed "a tweeter." The controller controls the first and second speaker transducers 325 and 326 to adjust their outputs. It is preferable that the controller increases the output of the first speaker transducer 325 used as, for example, a woofer, when the speaker parts are in a headset mode direction and the output of the second speaker transducer 326 used as, for example, a tweeter, when the speaker parts 320 are in a speaker mode direction.

In a modification of the present invention, the first and second speaker transducers can be stacked within each of the speaker parts. In this case, it is preferable that each of the speaker parts forms a resonant space between the first and second speaker transducers. In another modification of the present invention, each of the speaker parts is implemented to include only one speaker transducer.

Figure 10:
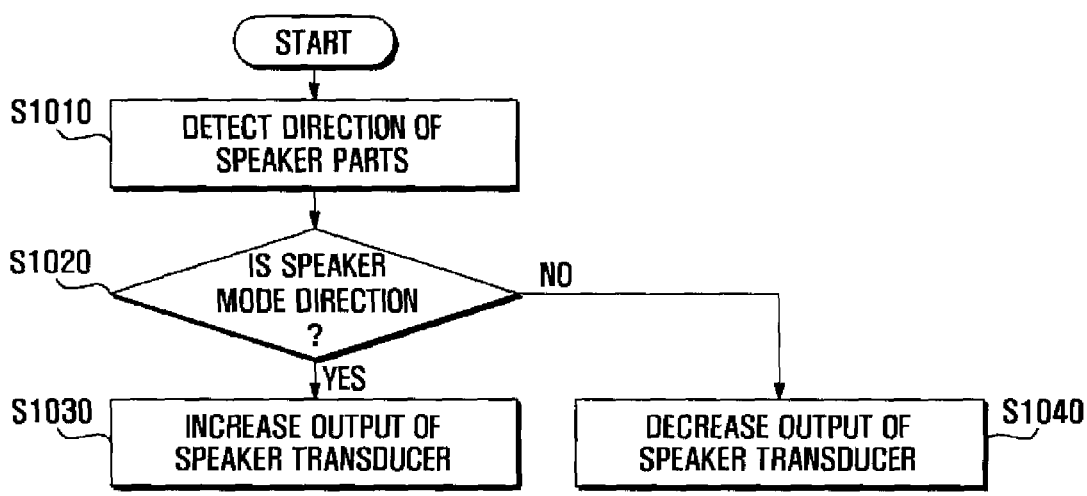
FIG. 10 is a flow chart illustrating a method for adjusting an output of the speaker transducers of a headset according to an embodiment of the present invention.

FIG. 10 is a flow chart illustrating a method for adjusting an output of the speaker transducers of a headset according to an embodiment of the present invention. This method can be applied to headsets having speaker parts whose direction can be altered.

When the headset is turned on, it is connected to a portable terminal via wired or short-range wireless communication, etc. The controller detects the direction of the speaker parts through the sensors (S1010) and determines whether the speaker parts are in a speaker mode direction or in a headset mode direction according to the detected direction of the speaker parts (S1020). When the controller ascertains that the speaker parts are in a speaker mode direction, it increases the output of the speaker transducers (S1030). When the controller ascertains that the speaker parts are in a headset mode direction, it decreases the output of the speaker transducers (S1040). When the output of the speaker transducers is increased, a user can listen to sounds without wearing the headset.

Figure 11:
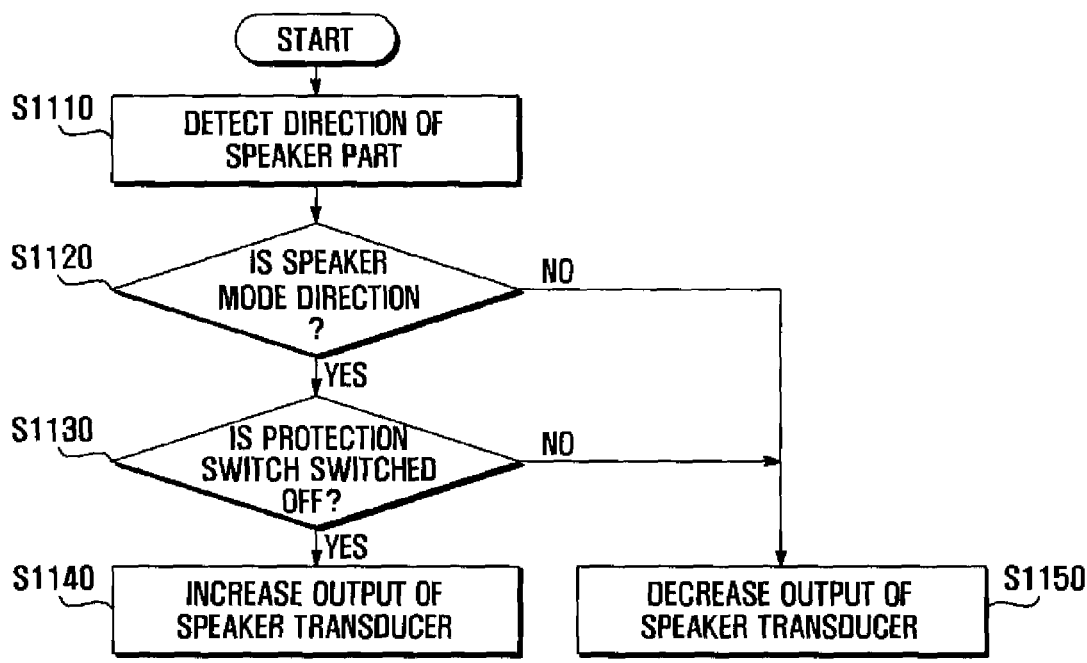
FIG. 11 is a flow chart illustrating a method for adjusting an output of the speaker transducers of a headset according to another embodiment of the present invention.

FIG. 11 is a flow chart illustrating a method for adjusting an output of the speaker transducers of a headset according to another embodiment of the present invention.

When the headset is turned on, it is connected to a portable terminal via wired or short-range wireless communication, etc. The controller detects the direction of the speaker parts through the sensors (S1110) and determines whether the speaker parts are in a speaker mode direction or in a headset mode direction according to the detected direction of the speaker pans (S1120). When the controller ascertains that the speaker parts are in a speaker mode direction, it checks whether the protection switch is switched off (S1130). When the controller ascertains that the protection switch is switched off, it increases the output of the speaker transducers (S1140). When the controller ascertains that the speaker parts are in a headset mode direction or that the protection switch is switched on while the speaker parts are in the speaker mode direction, it decreases the output of the speaker transducers (S1150). When the output of the speaker transducers is increased, a user can listen to sounds without wearing the headset.

The above-described methods according to the present invention can be realized in hardware or as software or computer code that can be stored in a recording medium such as a CD ROM, an RAM, a floppy disk, a hard disk, or a magneto-optical disk or downloaded over a network, so that the methods described herein can be rendered in such software using a general purpose computer, or a special processor or in programmable or dedicated hardware, such as an ASIC or FPGA. As would be understood in the art, the computer, the processor or the programmable hardware include memory components, e.g., RAM, ROM, Flash, etc. that may store or receive software or computer code that when accessed and executed by the computer, processor or hardware implement the processing methods described herein.

As described above, the headset according to the present invention can adjust a speaker output according to the direction of the speaker parts and allows the speaker parts to be used as an inner speaker and an external speaker. Therefore, additional external speaker are not necessary.

Also, since the speaker parts can be mechanically altered in their direction, the headset may be conveniently used as an external loud speaker.

Although exemplary embodiments of the present invention have been described in detail hereinabove, it should be understood that many variations and modifications of the basic inventive concept herein described, which may be apparent to those skilled in the art, will still fall within the spirit and scope of the exemplary embodiments of the present invention as defined in the appended claims.

What is claimed is:

1. A headset comprising:
   a signal receiver for receiving a signal from the outside;
   a speaker part, the speaker part having a speaker transducer;
   a hinge part corresponding to the speaker part, for changing the direction of the speaker part, the hinge part being located in close proximity to the speaker part, the hinge part including a switch which switches when the direction of the speaker part changes;
   an amplifier for amplifying the received signal, the amplifier being located between the signal receiver and the speaker part and;
   a controller for controlling the received signal to be transmitted from the signal receiver through the switch and the amplifier, to the speaker transducer when the switch is in a first state and to be transmitted through the switch directly to the speaker transducer bypassing the amplifier when the switch is in a second state, according to the direction of the speaker part which determines whether the switch is in the first state or in the second state.

2. The headset of claim 1, wherein the hinge part comprises a rotational hinge for rotating the speaker part continuously through a desired angle.

3. The headset of claim 1, wherein the signal receiver comprises a wireless communication unit.

4. The headset of claim 1, further comprising:
   a sensor for detecting the direction of the speaker part, the sensor being located in close proximity to the hinge part.

5. The headset of claim 4, wherein:
   the speaker transducer of the speaker part comprises first and second speaker transducers wherein the first speaker transducer operates as a woofer and the second speaker transducer operates as a tweeter.

6. The headset of claim 5, wherein the controller controls the first and second speaker transducers individually.

7. The headset of claim 4, wherein the signal receiver comprises a wireless communication unit.

8. The headset of claim 1, wherein:
   the hinge part comprises a rotational hinge for rotating the speaker part to a desired angle;
   the speaker part is operated in a headset mode direction or in a speaker mode direction according to its rotation, wherein the controller decreases the output of the speaker transducer when the speaker part is in the headset mode direction and increases the output of the speaker transducer when the speaker part is in the speaker mode direction.

9. The headset of claim 8, wherein the controller, responsive to the setting of a protection switch, controls the amplifier to increase the output of the speaker transducer when the speaker part is in a speaker mode direction and when the setting indicates that the protection switch is switched off.

10. The headset of claim 8, wherein:
    the hinge part further comprises a collapsible hinge for collapsing the speaker part with respect to the lengthwise center axis of a headband.

11. The headset of claim 10, wherein:

the headband forms a flat surface on at least one part thereof; and the speaker part is in a standing position on the ground in the speaker mode when the flat surface of the headband is placed on the ground and the headband serves as a support.

12. A method for adjusting the output of a speaker transducer in a headset that has a speaker part whose direction can be changed, the method comprising:

detecting a direction of the speaker part;

switching a switch between first and second states depending on the detected direction of the speaker part;

determining when the detected direction of the speaker part is in a speaker mode direction and determining when the detected direction of the speaker part is in a headset mode direction different from the speaker mode direction;

responsive to when the speaker part is oriented in the speaker mode direction, electrically connecting a signal receiver through a switch in the first state and through an amplifier to the speaker transducer, thereby increasing the output of the speaker transducer of the speaker part in the speaker mode direction; and responsive to when the speaker part is oriented in the headset mode direction, electrically connecting the signal receiver through the switch in the second state directly to the speaker transducer and bypassing the amplifier, thereby decreasing an output of the speaker transducer in the headset mode direction.

13. The method of claim 12, wherein the determination of the detected direction comprises:

checking whether a protection switch is switched off; and increasing the output of speaker transducer.

14. An apparatus for adjusting the output of a speaker transducer in a headset that has a speaker part whose direction can be changed, comprising a processor in communication with a memory, the processor executing code for:

detecting a direction of the speaker part;

switching a switch between first and second states depending on the detected direction of the speaker part;

determining when the detected direction of the speaker part is in a speaker mode direction and determining when the detected direction of the speaker part in a headset mode direction different from the speaker mode direction;

responsive to when the speaker part is oriented in the speaker mode direction, electrically connecting a signal receiver through a switch in the first state and through an amplifier to the speaker transducer, thereby increasing the output of the speaker transducer of the speaker part in the speaker mode direction; and responsive to when the speaker part is oriented in the headset mode direction, electrically connecting the signal receiver through a switch in the second state directly to the speaker transducer and bypassing the amplifier, thereby decreasing an output of the speaker transducer in the headset mode direction.

15. The apparatus of claim 14, wherein the determination of the detected comprises:

checking whether a protection switch is switched off; and increasing the output of speaker transducer.

16. A headset comprising:

a signal receiver for receiving a signal from the outside;

a speaker part, the speaker part having a speaker transducer;

a hinge part corresponding to the speaker part, for changing the direction of the speaker part, the hinge part being located in close proximity to the speaker part, the hinge part including a switch which switches when the hinge part changes the direction of the speaker part; and an amplifier for amplifying the received signal, the amplifier being located between the signal receiver and the speaker part, wherein the switch of the hinge part switches an electrical connection path from the signal receiver to the speaker transducer, so that the received signal is transmitted from the signal receiver through the switch and the amplifier to the speaker transducer when the switch is in a first state, and is transmitted directly through the switch to the speaker transducer bypassing the amplifier when the switch is in a second state, according to the direction of the speaker part which determines whether the switch is in the first state or in the second state.

* * * * *